US007504979B1

(12) United States Patent
Knausz et al.

(10) Patent No.: US 7,504,979 B1
(45) Date of Patent: Mar. 17, 2009

(54) SYSTEM AND METHOD FOR PROVIDING AN ULTRA LOW POWER SCALABLE DIGITAL-TO-ANALOG CONVERTER (DAC) ARCHITECTURE (75) Inventors: Imre Knausz, Fairport, NY (US); Robert J. Bowman, Fairport, NY (US)

(73) Assignees: National Semiconductor Corporation, Santa Clara, CA (US); Rochester Institute of Technology, Rochester, NY (US)

(*) Notice: Subject to any disclaimer, the term of this patent is extended or adjusted under 35 U.S.C. 154(b) by 15 days.

(21) Appl. No.: 11/507,224

(22) Filed: Aug. 21, 2006

(51) Int. Cl.
*H03M 1/78* (2006.01)
(52) U.S. Cl. .................. 341/154; 341/141; 341/144; 341/153; 345/89; 345/98; 345/100; 345/294
(58) Field of Classification Search ......... 341/144–154; 345/89, 98, 100, 294
See application file for complete search history.

(56) References Cited

U.S. PATENT DOCUMENTS

| | | | | |
|---|---|---|---|---|
| 4,539,553 | A * | 9/1985 | Takeda et al. | 341/154 |
| 5,424,740 | A * | 6/1995 | Chang et al. | 341/147 |
| 5,714,953 | A * | 2/1998 | Mitani et al. | 341/144 |
| 6,181,263 | B1 * | 1/2001 | Malik et al. | 341/118 |
| 6,603,466 | B1 * | 8/2003 | Sakaguchi et al. | 345/204 |
| 6,747,626 | B2 * | 6/2004 | Chiang | 345/98 |
| 7,015,847 | B1 * | 3/2006 | McLachlan et al. | 341/145 |
| 7,221,304 | B2 * | 5/2007 | Yen | 341/145 |
| 7,250,891 | B2 * | 7/2007 | Nishimura | 341/154 |
| 7,327,339 | B2 * | 2/2008 | Akimoto et al. | 345/690 |
| 2002/0186231 | A1 * | 12/2002 | Kudo et al. | 345/690 |
| 2005/0007393 | A1 * | 1/2005 | Akai et al. | 345/690 |
| 2005/0122321 | A1 * | 6/2005 | Akai et al. | 345/204 |
| 2007/0139328 | A1 * | 6/2007 | Lan | 345/89 |
| 2007/0146187 | A1 * | 6/2007 | Chia | 341/144 |

OTHER PUBLICATIONS

Sedra et al., "Microelectronic Circuits," 2004, 1 page.
Kazuya Sone et al., "A 10-b 100-Msample/s Pipelined Subranging BiCMOS ADC," IEEE Journal of Solid-State Circuits, vol. 28, No. 12, Dec. 1993, pp. 1180-1186.
Adib R. Hamade, "A Single Chip All-MOS 8-Bit A/D Converter," IEEE Journal of Solid-State Circuits, vol. SC-13, No. 6, Dec. 1978, pp. 785-791.
Andre Abrial et al., "A 27-MHz Digital-to-Analog Video Processor," IEEE Journal of Solid-State Circuits, vol. 23, No. 6, Dec. 1988, pp. 1358-1369.
Antonio J. Lopez-Martin et al., "Low-Voltage Super Class AB CMOS OTA Cells With Very High Slew Rate and Power Efficiency," IEEE Journal of Solid-State Circuits, vol. 40, No. 5, May 2005, pp. 1068-1077.
K. Nagaraj, "CMOS Amplifiers Incorporating a Novel Slew Rate Enhancement Technique," IEEE 1990 Custom Integrated Circuits Conference, pp. 11.6.1-11.6.5.
R. Klinke et al., "A Very-High-Slew-Rate CMOS Operational Amplifier," IEEE Journal of Solid-State Circuits, vol. 24, No. 3, Jun. 1989, pp. 744-746.
Johns et al., "Analog Integrated Circuit Design," 1997, 3 pages.

* cited by examiner

*Primary Examiner*—Linh V Nguyen (57) ABSTRACT

A system and method are disclosed for providing an ultra low power scalable digital-to-analog converter architecture. Refresh buffer circuits are provided to buffer a voltage reference resistor string. The refresh buffer circuits may be coupled to the resistor string at selected binary fold points. The refresh buffer circuits can reduce the output impedance of the resistor string. Also, each digital-to-analog converter channel can be provided with a multi-dimensional multiplexer that minimizes settling time. The number of refresh buffer circuits and the number of dimensions of the multiplexer can be selected to maximize circuit performance for a given load capacitance and bit rate of the digital-to-analog converter.

23 Claims, 7 Drawing Sheets

SYSTEM AND METHOD FOR PROVIDING AN ULTRA LOW POWER SCALABLE DIGITAL-TO-ANALOG CONVERTER (DAC) ARCHITECTURE

TECHNICAL FIELD OF THE INVENTION

The present invention is generally directed to the manufacture of digital-to-analog converter (DAC) circuits and, in particular, to a system and method for providing an ultra low power scalable digital-to-analog converter (DAC) architecture that is optimized for small format liquid crystal display (LCD) applications.

BACKGROUND OF THE INVENTION

Portable electronic devices present significant design challenges because they require displays that are small in size, relatively high in resolution and low in power dissipation. The electronics that drive small format displays must also occupy a small footprint and minimize the external component count. The ideal display driver needs to be flexible because a large number of different types of liquid crystal display (LCD) materials exist with different drive requirements.

A relatively high resolution data converter is necessary to drive the liquid crystals with adequate resolution due to the fact that displays are highly non-linear. An ideal display driver architecture should be easily expandable in the number of outputs and resolution to accommodate larger displays with higher resolution.

There are many portable electronic devices that require low power, small area digital-to-analog converters (DACs). Such devices include, without limitation, small format display drivers for personal digital assistants (PDAs), image viewers, headset displays, cell phones, game players, remote control devices, remote data acquisition and control modules, portable instruments, portable sound systems, and other types of devices that require a voltage output that is proportional to a digital value.

DACs are general purpose building blocks for providing an analog voltage or current that is proportional to a digital value that is presented to its inputs. DACs are commonly used to provide an analog output signal from a digital processing system such as a computer. One can view a DAC as a black box that converts a digital word into a corresponding analog signal that represents the same approximate percentage of full scale.

Small format electronic displays are commonly used in portable electronic instruments. Liquid crystal display (LCD) technology is a popular display technology because of its good display properties and low power dissipation. A display array comprises a plurality of small display dots called pixels that are arranged in a row and column structure. The information to be displayed on a single pixel requires selection of the pixel location and the corresponding value for the intensity of light to be transmitted by the pixel. The intensity of light to be emitted can vary over a range of five hundred twelve (512) to one (1) or larger depending on the video or image program information requirements.

In the case of pixel displays, DACs are used to translate a digital value into an analog signal that corresponds to the proper light intensity for a pixel.

Because extreme price pressures exist on the manufacture of display modules, the design of display modules is limited to basic complementary metal oxide semiconductor (CMOS) technology. A basic CMOS process does not contain low threshold voltage transistors, high sheet resistance poly resistors, or poly to poly capacitors. Integrated circuits for display drivers must be designed around these limitations.

Therefore, the technology available for designing small format LCD display drivers imposes stringent requirements on the design of column driver digital-to-analog converters (DAC). The column driver DACs must be small in size, exhibit fast settling time, and dissipate low quiescent power. The DAC architecture must also be easily expandable with multiple channels to support higher display resolutions.

A quarter VGA (Video Graphics Array) display comprises an array of three hundred twenty (320) pixels by two hundred forty (240) pixels. A quarter VGA display using an eighty (80) to one (1) source line multiplex ratio on the display panel requires twelve (12) DAC channels to drive the nine hundred sixty (960) source lines on the display panel. A display panel with a sixty Hertz (60 Hz) frame rate, two hundred forty (240) lines, and no blanking, requires a maximum pixel refresh time of eight hundred sixty (860) nanoseconds.

A common prior art approach to driving small format displays is to use a plurality of resistors in a reference resistor string as a voltage reference for the DAC. A digital word decoder selects the resistor voltage tap on the reference resistor string that corresponds to the desired analog voltage and passes it to an output amplifier. This type of DAC architecture is referred to as an R-string DAC architecture. R-string DACs are popular because the output is monotonic and one can develop a DAC conversion compensation curve by using non-equal resistor segments in the reference resistor string. A DAC conversion compensation curve permits correction for the non-linear transmissivity of LCD display material and the response of the human eye.

Figure 1:
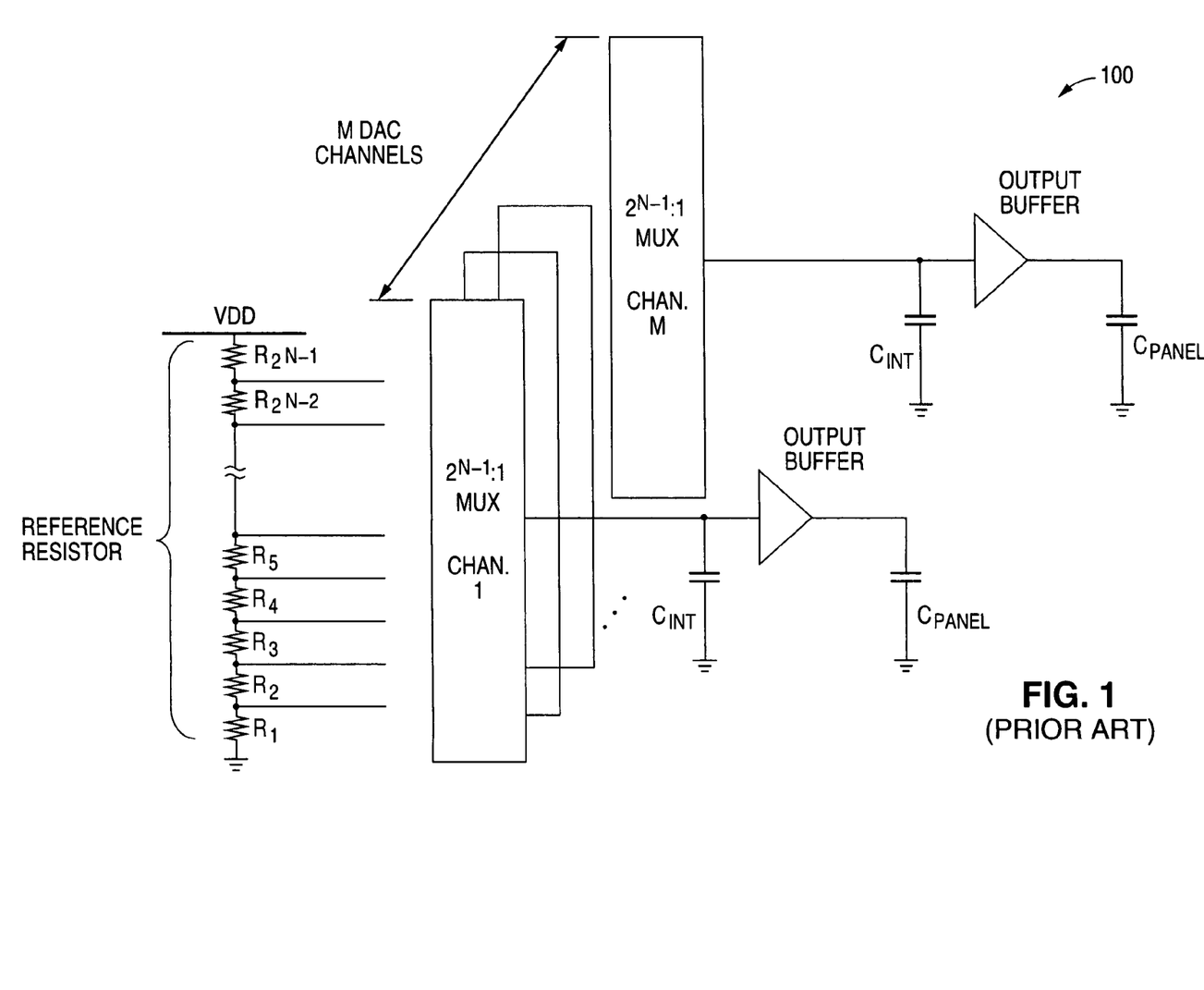
FIG. 1 illustrates a schematic representation of a prior art DAC architecture.

FIG. 1 illustrates a schematic representation of a conventional R-string DAC architecture 100 that comprises a number (M) Of DAC channels. DAC architecture 100 comprises a reference resistor 110 associated with the first DAC channel (i.e., DAC Channel 1). One end of reference resistor 110 is coupled to power supply VDD and the other end of reference resistor 110 is coupled to ground. Reference resistor 110 comprises a number ($2^N-1$) of resistor segments (designated $R_1$ through $R_2^N-1$) coupled together sequentially.

DAC architecture 100 also comprises a number (M) of multiplexers that are designated with reference numerals 120(1) through 120(M). There is one multiplexer 120 for each of the M DAC channels of the DAC architecture 100. The multiplexer 120(1) that is associated with DAC Channel 1 is designated as MUX Channel 1. The multiplexer 120(M) that is associated with DAC Channel M is designated as MUX Channel M. The inputs of each multiplexer are coupled to the reference resistor 110 between each of the $2^N-1$ resistor segments.

The reference voltages from the reference resistor 110 are digitally selected by the multiplexers 120. As shown in FIG. 1, the inputs of MUX Channel 1 are connected to the reference resistor 110 between each of the $2^N-1$ resistor segments. MUX Channel 1 digitally selects the reference voltages from the reference resistor 110. The other multiplexers operate in the same manner.

The reference voltage that is selected by each of the M multiplexers 120 is output to an associated output buffer. There is one output buffer associated with each multiplexer. The M output buffers are designated with reference numerals 130(1) through 130(M). The output buffer 130(1) that is coupled to MUX Channel 1 is designated as Output Buffer 1. The output buffer 130(M) that is coupled to MUX Channel M is designated as Output Buffer M.

The internal load capacitance (designated $C_{INT}$) between a multiplexer and its output buffer comprises the parasitic capacitances of routing, multiplexer devices, and the input capacitance of the output buffer. The selected reference voltage is passed through its respective output buffer to drive a large panel capacitance (designated $C_{PANEL}$).

The use of R-string DAC architecture is hampered by the presence of increased power dissipation in the R-string and poor settling time. Some prior art R-string DAC architectures use resistor segments in the R-string that have non equal values of resistance. Some other prior art R-string DAC architectures use a higher resolution R-string DAC that employs a look up table for curvature correction. Both of these prior art approaches require excessive power consumption.

The prior art DAC architecture 100 shown in FIG. 1 exhibits significant deficiencies. One deficiency is that there is a major time constraint in the reference resistor string and in the parasitic capacitances that must be driven. Another deficiency is that there is another major time constraint in the multiplexer parasitic resistances and capacitances.

Therefore, there is a need in the art for an improved ultra low power scalable DAC architecture that is optimized for small format liquid crystal display (LCD) applications. Specifically, there is a need in the art for an improved ultra low power scalable DAC architecture that can remedy the above described deficiencies of prior art DAC architectures.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 2 through 12, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged digital-to-analog converter circuitry.

Figure 2:
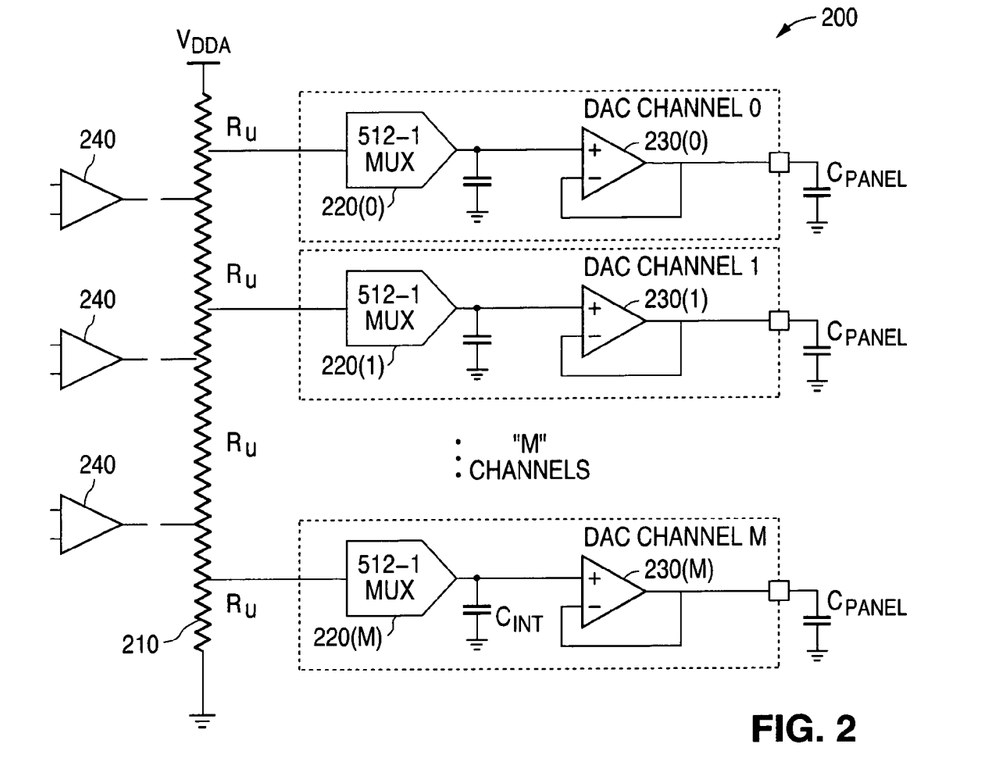
FIG. 2 illustrates a schematic representation of a DAC architecture of the present invention.

FIG. 2 illustrates a schematic representation of an ultra low power DAC architecture 200 of the present invention. As shown in FIG. 2, DAC architecture 200 comprises a number (M+1) of DAC channels. The M+1 DAC channels are designated DAC Channel 0, DAC Channel 1, and so on, up through DAC Channel M. DAC 200 architecture is based on a resistor divider voltage reference resistor string 210. For each DAC channel, the reference voltages are selected from the resistor string 210 through a multiplexer. The selected reference voltage is then buffered so that a significant load can be driven with the output of a DAC channel.

One end of resistor string 210 of DAC architecture 200 is coupled to power supply $V_{DDA}$ and the other end of resistor string 210 is coupled to ground. As will be more fully described below, resistor string 210 comprises a number of resistor segments (designated $R_U$) coupled together sequentially. The value of the total resistance ("R") of resistor string 210 is the sum of the values of the resistance of the resistor segments $R_U$.

DAC architecture 200 also comprises a number (M+1) of multiplexers. The M+1 multiplexers are designated with reference numerals 220(0) through 220(M). There is one multiplexer for each of the M+1 DAC channels. Each multiplexer has a range of five hundred twelve (512) to one (1) for selecting pixel reference voltages. The multiplexer 220(0) that is associated with DAC Channel 0 is designated as MUX Channel 0. The multiplexer 220(1) that is associated with DAC Channel 1 is designated as MUX Channel 1. The multiplexer 220(M) that is associated with DAC Channel M is designated as MUX Channel M. The inputs of each multiplexer 220 are coupled to the resistor string 210 in a manner that will be more fully described below.

The pixel reference voltages from the resistor string 210 are digitally selected by the multiplexers. As shown in FIG. 2, the inputs of MUX Channel 0 are connected to the resistor string 210. MUX Channel 0 digitally selects the pixel reference voltages from the resistor string 210. The other multiplexers operate in the same manner.

The pixel reference voltage that is selected by each of the M+1 multiplexers is output to an associated output buffer. There is one output buffer associated with each multiplexer. The M+1 output buffers are designated with reference numerals 230(0) through 230(M). The output buffer 230(0) that is coupled to MUX Channel 0 is designated as Output Buffer 0.

The output buffer 230(1) that is coupled to MUX Channel 1 is designated as Output Buffer 1. The output buffer 230(M) that is coupled to MUX Channel M is designated as Output Buffer M.

The internal load capacitance (designated $C_{INT}$) between a multiplexer and its output buffer comprises the parasitic capacitances of routing, multiplexer devices, and the input capacitance of the output buffer. The selected reference voltage is passed through its respective output buffer to drive a large panel capacitance (designated $C_{PANEL}$).

There can be M+1 unique and independent DACs created from the single voltage reference. The advantages of DAC architecture 200 are (1) that is has inherent low power, (2) that is has easy scalability to add additional DAC channels, (3) built-in gamma correction using non-uniform divider resistors, and (4) that the DAC channels will match to within the offset of two output buffers.

In order to minimize power consumption in the resistor string 210, the value of the total resistance ("R") of resistor string 210 is made relatively high. However, a large value of R degrades the settling time. Therefore, it is desirable to reduce the output impedance of the resistor string 210.

In order to reduce the output impedance of the resistor string 210, the resistor string 210 is buffered by adding refresh buffers 240 at the binary fold points of the resistor string 210. The binary fold points are the points of maximum equivalent driving point resistance. The resistor string 210 is buffered at the binary fold points by creating $2^N$ segments of the resistor string 210. Each time the resistor string is folded, the worst case impedance, seen looking into the resistor string 210, will be cut in half.

Consider, for example, the arrangement that is shown in FIG. 2. Dividing the resistor string 210 into four (4) equal segments requires three (3) refresh buffers 240. This reduces the driving source impedance from R/4 (in the case of a single fold) to R/16. Generally there are $2^N-1$ refresh buffers 240 required where N is equal to the number of "folds". In the arrangement that is shown in FIG. 2, there are three (3) refresh buffers because there are two (2) folds. The expression $2^N-1$ is equal to three (3) when the value of N is equal to two (2).

Prior art arrangements require the use of a second resistor string in order to provide a voltage to the refresh buffers. Providing a second resistor string requires additional circuitry. The second resistor string also consumes additional power. It is also difficult to match the two resistor strings.

In the present invention, the resistor string 210 is buffered by adding refresh buffers 240 at the binary fold points of the resistor string 210. Therefore, the present invention does not require the use of a second resistor string.

Figure 3:
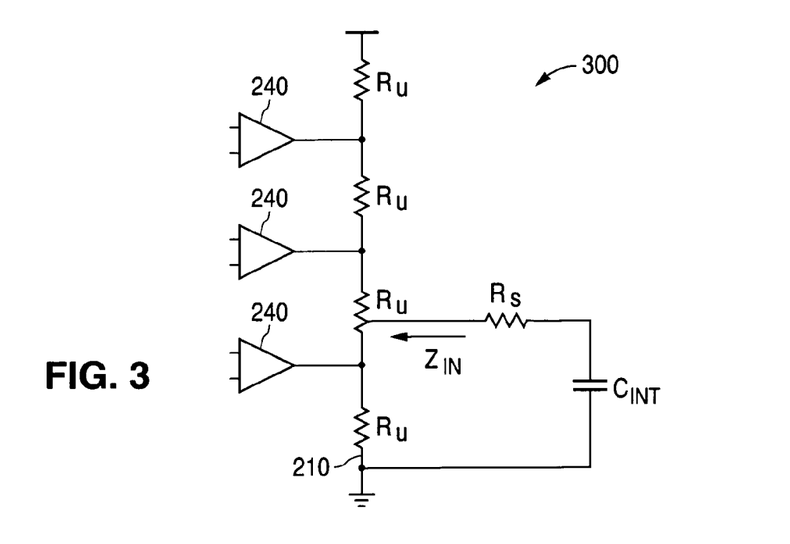
FIG. 3 illustrates a simplified model schematic representation of a reference circuit having a buffered R-string architecture.

FIG. 3 illustrates a circuit diagram that shows a reference circuit 300 that has a buffered R-string architecture. The reference circuit 300 has two "folds." Each time a fold is created, a refresh buffer 240 is inserted at the center point of the unit resistors (designated $R_U$). The point in a resistor string with the highest effective impedance is the center point between two refresh buffers (or a refresh buffer and a supply rail). Therefore, it is logical to place the refresh buffer 240 at this center point to reduce the impedance. The number of unit resistors ($R_U$) is equal to $2^N$ when N is the number of folds and the total number of refresh buffer amplifiers is ($2^N-1$). The resistance $R_S$ is the total series resistance of a multiplexer 220 of the type that is shown in FIG. 2.

To ensure an adequate settling time, a general expression for minimizing power and achieving settling time will be derived. The total system power is given by the expression:

$$P_{TOTAL}=P_{BUFFER}+P_{RESISTOR} \quad \text{(Eq. 1)}$$

The power that is dissipated in the total value of resistance of the resistor string 210 is given by the expression:

$$P_{RESISTOR} = \frac{V^2}{R} \quad \text{(Eq. 2)}$$

where the letter R represents the total resistance of the resistor string 210 (N times $R_U$). The power dissipated in the refresh buffer 240 is given by the expression:

$$P_{BUFFER}=V \times I_b \times (2^N-1) \quad \text{(Eq. 3)}$$

The term $I_b$ represents the refresh buffer amplifier bias current consumption. It is important to include this term in the power calculations because the refresh buffer power will have an effect on how many folds are used. Finally, the total reference power is equal to the power dissipated in the resistor and in the amplifiers.

$$P_{TOTAL} = \frac{V^2}{R} + V \times I_b \times (2^N - 1) \quad \text{(Eq. 4)}$$

Figure 4:
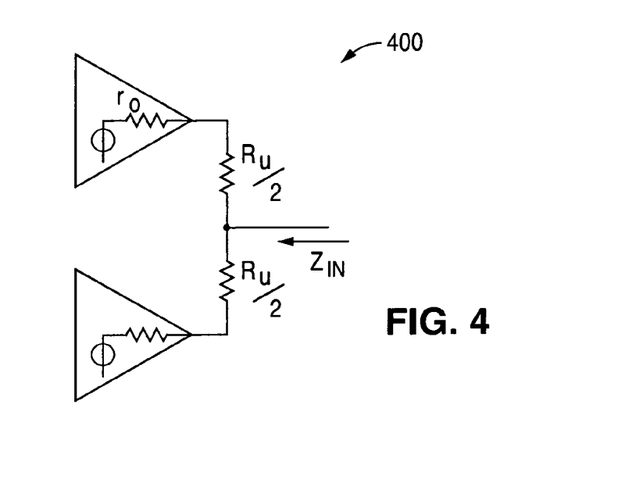
FIG. 4 illustrates a schematic representation of a highest impedance point on a reference resistor string.

The next step is to calculate the worst case setting of the load capacitor. FIG. 4 illustrates a more detailed circuit diagram 400 of the highest impedance point on the resistor string 210. The worst case output impedance is naturally the center point of the unit resistor ($R_U$) between two refresh buffer amplifiers. This is because the refresh buffer amplifiers have much higher output impedance than the power supplies. The expression for $Z_{IN}$ is found to be:

$$Z_{IN} = \frac{r_O + \frac{R_U}{2}}{2} = \frac{r_O}{2} + \frac{R_U}{4} \quad \text{(Eq. 5)}$$

Referring to FIG. 3, the time constant ξ is seen to be:

$$\tau=(Z_{IN}+R_S) \times C_{INT} \quad \text{(Eq. 6)}$$

The time constant τ is specified by considering the settling time requirement. For a nine (9) bit digital-to-analog converter (DAC), a total settling time of five (5) time constants (5 times τ) is required to settle to an accuracy of one Least Significant Bit (LSB). Settling time must also be allotted to the output buffer 230. After the maximum settling time for the reference has been determined, one can divide that value by five (5) to find the time constant τ. Substituting Equation 5 into Equation 6 and solving for $R_U$, one obtains:

$$R_U = 4 \times \left( \frac{\tau}{C_{INT}} = R_S \right) - 2 \times r_O \quad \text{(Eq. 7)}$$

The number of unit resistors is related to the total resistance R by the expression:

$$R=2^N \times R_U \quad \text{(Eq. 8)}$$

Solving for N one obtains the expression:

$$N = \frac{\log\left(\frac{R}{R_U}\right)}{\log 2} \quad \text{(Eq. 9)}$$

After inserting the value of $R_U$ from Equation 7, one has an expression for N in which R is the only unknown value.

$$N = \frac{\log\left[\dfrac{R}{\dfrac{4\tau}{C_{INT}} - 2 \times r_O - 4 \times R_S}\right]}{\log 2}.$$ (Eq. 10)

Similarly, by using Equation 8, another useful expression for $2^N$ can be found:

$$2^N = \frac{R}{\dfrac{4\tau}{C_{INT}} - 2 \times r_O - 4 \times R_S}$$ (Eq. 11)

Putting the expression for $2^N$ that is set forth in Equation 11 into the expression for the total reference power that is set forth in Equation 4 gives the following expression:

$$P_{TOTAL} = \frac{V^2}{R} + V \times I_b \times \left(\frac{R}{\left(\dfrac{4\tau}{C_{INT}} - 2 \times r_O - 4 \times R_S\right)} - 1\right)$$ (Eq. 12)

Now that one has an expression for the number of folds in terms of R-string resistance and other constants, one has an expression for the total power that has R as the only variable. One can now find the minimum total power by differentiating the total power $P_{TOTAL}$ of Equation 12 with respect to R and then setting the result to zero and solving for R to find the minimum of the function:

$$\frac{\partial P_{TOTAL}}{\partial R} = -\frac{V^2}{R^2} + \frac{V \times I_b}{\left(\dfrac{4\tau}{C_{INT}} - 2 \times r_O - 4 \times R_S\right)} = 0$$ (Eq. 13)

Finally, the value of R that results in a minimum value for the total system power is found to be given by the expression:

$$R = \sqrt{\frac{V \times \left(\dfrac{4\tau}{C_{INT}} - 2 \times r_O - 4 \times R_S\right)}{I_b}}$$ (Eq. 14)

After one has calculated the value of R from the system constants and requirements, one can easily calculate the number of folds and the unit resistance ($R_U$) using the expression for N that is set forth in Equation 10.

Figure 5:
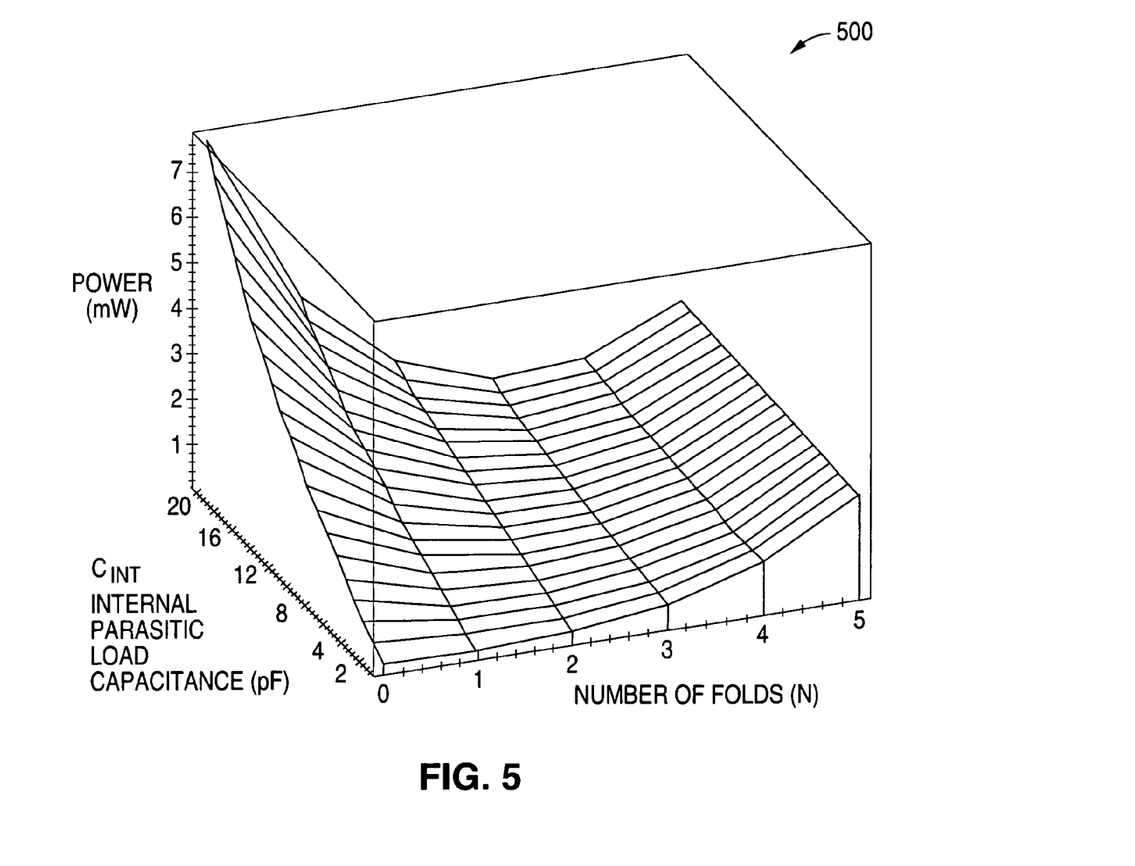
FIG. 5 illustrates a three dimensional curve that relates power versus load capacitance versus a number of folds in the digital-to-analog converter circuit of the present invention.

Having mathematical expressions for determining the optimal number of folds to be used for the lowest power is very useful in designing a multi-channel DAC where scaling to a number of DACs (e.g., scaling to M+1 DACs) is a crucial feature. FIG. 5 illustrates a three dimensional curve 500 that relates the power in milliwatts (mW) versus the load capacitance ($C_{INT}$) in picofarads (pF) versus the number of folds (N). The load capacitance $C_{INT}$ is directly proportional to the number (M+1) of DACs. FIG. 5 shows that increasing the number of folds (N) as the load capacitance ($C_{INT}$) increases will lower the value of power (mW).

The load capacitance ($C_{INT}$) represents the number of DAC channels (M+1) using the resistor string 210 as a reference. It is interesting to note that as $C_{INT}$ increases, it becomes more important to use folds. For a load capacitance of ten picofarads (10 pF), it is noted that power can be reduced by a factor of approximately three (3) by adding two (2) folds. This is a very large power savings over prior art arrangements. The method of the present invention determines the load capacitance ($C_{INT}$) and then determines the number of folds (N) for the resistor string 210 that are required to minimize power consumption in the resistor string 210.

A unique feature of the DAC architecture of the present invention is the method that is used to buffer the resistor string 210. A switched capacitor circuit is used to sample the voltages on the resistor string 210 during a quiescent period of the conversion cycle. Then during the driving portion of the conversion cycle, the resistor string 210 is driven by the refresh buffer 240.

The refresh buffer 240 may be implemented by a sample and hold circuit. For example, the prior art sample and hold circuit 600 shown in FIG. 6 may be used. Sample and hold circuit 600 is described in a publication by K. Sone et al. entitled "A 10-b 100-Msample/s Pipelined Subranging BiCMOS ADC," published in IEEE Journal of Solid-State Circuits, Volume 28, pp. 1180–1186, December 1993.

Figure 6:
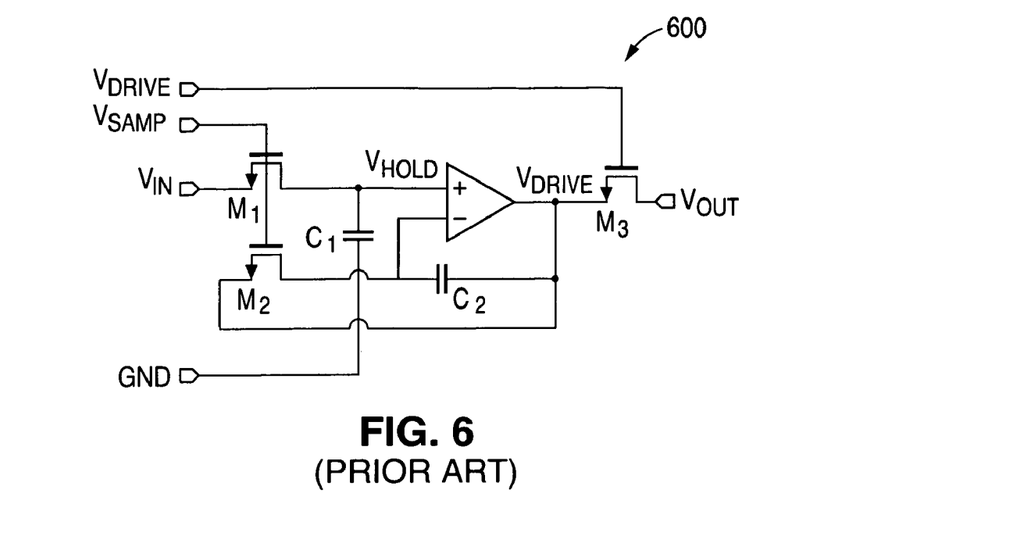
FIG. 6 illustrates a prior art sample and hold circuit.
Figure 7:
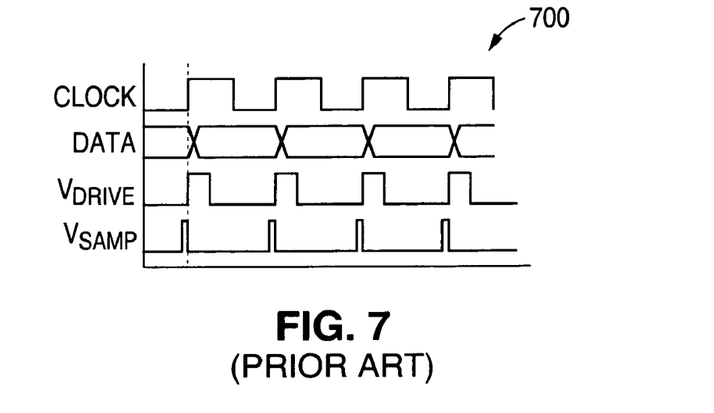
FIG. 7 illustrates a timing diagram for the prior art sample and hold circuit shown in FIG. 6.

The voltage $V_{IN}$ in FIG. 6 is the same point on the resistor string 210 that $V_{OUT}$ is driving. The advantage of this sample and hold circuit 600 is that clock feed-through and charge injection are canceled. The cancellation occurs when the sampling switches controlled by $V_{samp}$ in FIG. 6 are turned off, causing the extra charge to be stored in the feedback capacitor as well as in the holding capacitor. This introduces an offset in the feedback loop that cancels the voltage error on the holding capacitor. This allows the use of very small holding capacitors ($C_1$ and $C_2$) that save space. The timing diagram 700 shown in FIG. 7 describes the control signal sequencing.

During the first part of the conversion cycle, the resistor string 210 is buffered. This will lower the effective output impedance of the resistor string 210 and allow it to drive the multiplexers 220 much faster. The refresh buffers 240 are then disconnected during the second half of the conversion cycle. At the end of the conversion cycle when the resistor string 210 is settled, the reference voltage can be sampled back into the sample and hold circuit 600.

Because a CMOS amplifier is used, the only leaking path that will cause droop is the reverse biased drain to bulk diodes of the input switch. This is a very low leakage path. Therefore, it may only be necessary to sample the reference voltage once every few hundred conversions. Regardless of the leakage, errors in sampling or offsets in the refresh buffer amplifiers will not affect the DAC accuracy. The refresh buffer amplifier only drives the resistor string 210 for part of the conversion cycle. As soon as the refresh buffer amplifier is disconnected, the intrinsic drive of the resistor string 210 will return the nodes to the proper voltage by the end of the conversion cycle.

It is also possible to save additional power by powering down the refresh buffer amplifier 240 when it is not driving the resistor string 210. This can potentially save seventy five percent (75%) of the power in the refresh buffer amplifiers 240, depending on the duty cycle of the $V_{drive}$ voltage. Unfortunately, for high speed conversion, this power saving is not always possible due to the long time constants that are involved in powering up an amplifier. However, it may be possible to put the amplifier into a "low power" mode with the quiescent current greatly reduced and thereby approach the seventy five percent (75%) theoretical power savings with a $V_{drive}$ duty cycle of twenty five percent (25%).

Figure 8:
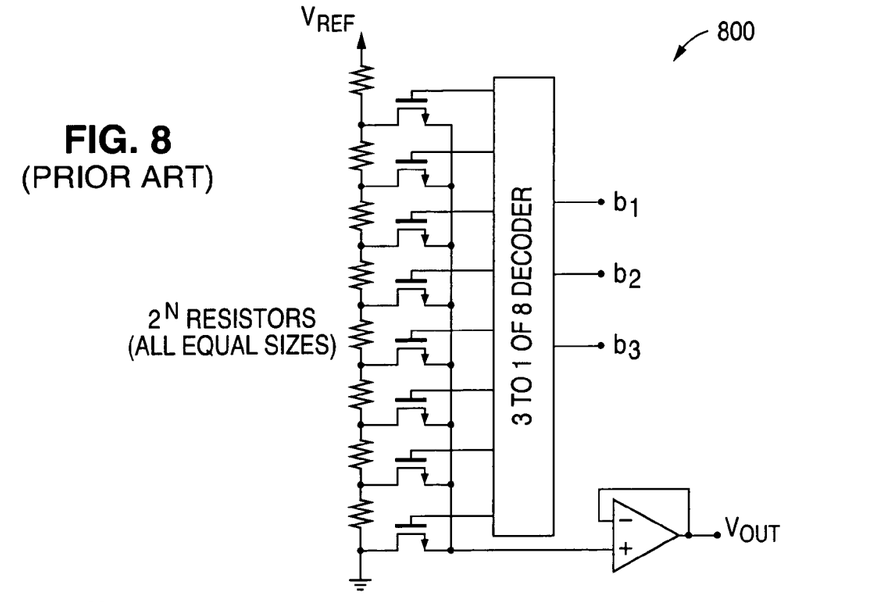
FIG. 8 illustrates a prior art full decode multiplexer architecture.
Figure 9:
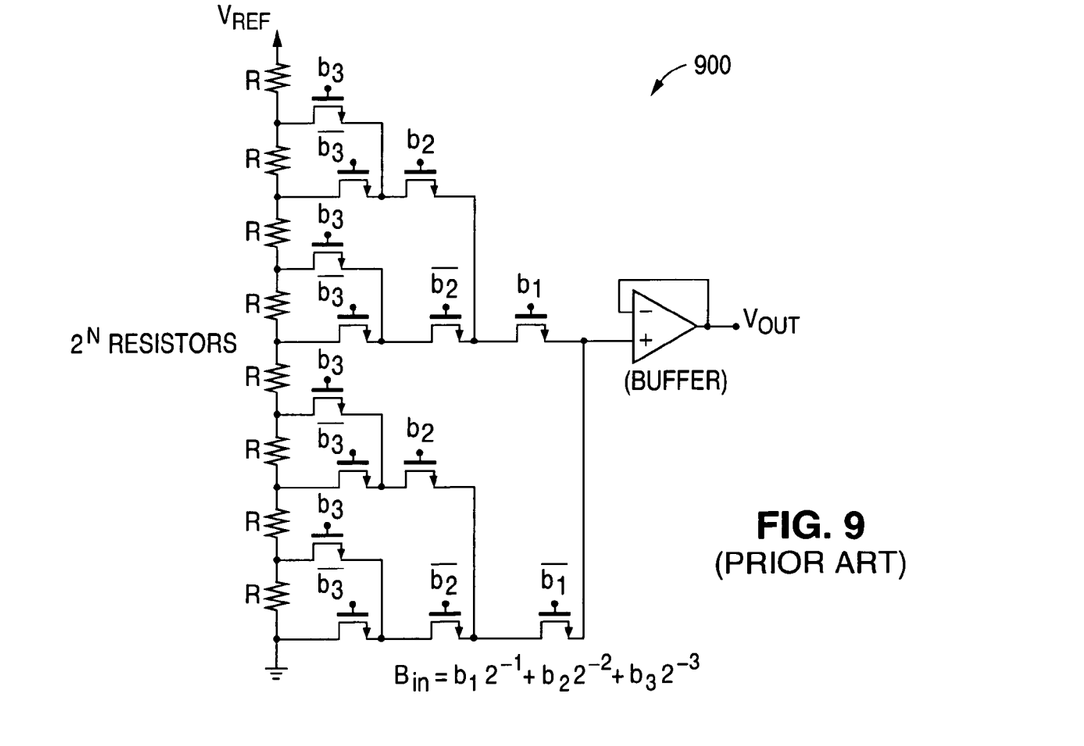
FIG. 9 illustrates a prior art tree decode multiplexer architecture.

We now turn to the implementation of the multiplexer circuitry (also referred to as the decoder circuitry). FIG. 8 illustrates a first prior art decoder architecture known as a "full decode" multiplexer 800. FIG. 9 illustrates a second prior art decoder architecture known as a "tree decode" multiplexer 900.

The advantage of the full decode multiplexer 800 is that it is unit cell based, easy to copy and replicate when designing the circuit and layout, and it has minimal series resistance. The disadvantage of the full decode multiplexer 800 is that it has a large amount of output capacitance that is due to all of the device junctions connected to the output. The large output capacitance places a large burden on the resistor string 210 which will slow down the operation of the multiplexer.

The "tree decode" multiplexer 900 solves this problem (and uses almost no decode logic). However, the series resistance of the "tree decode" multiplexer 900 is increased to the resolution of the multiplexer multiplied by the switch resistance.

Figure 10:
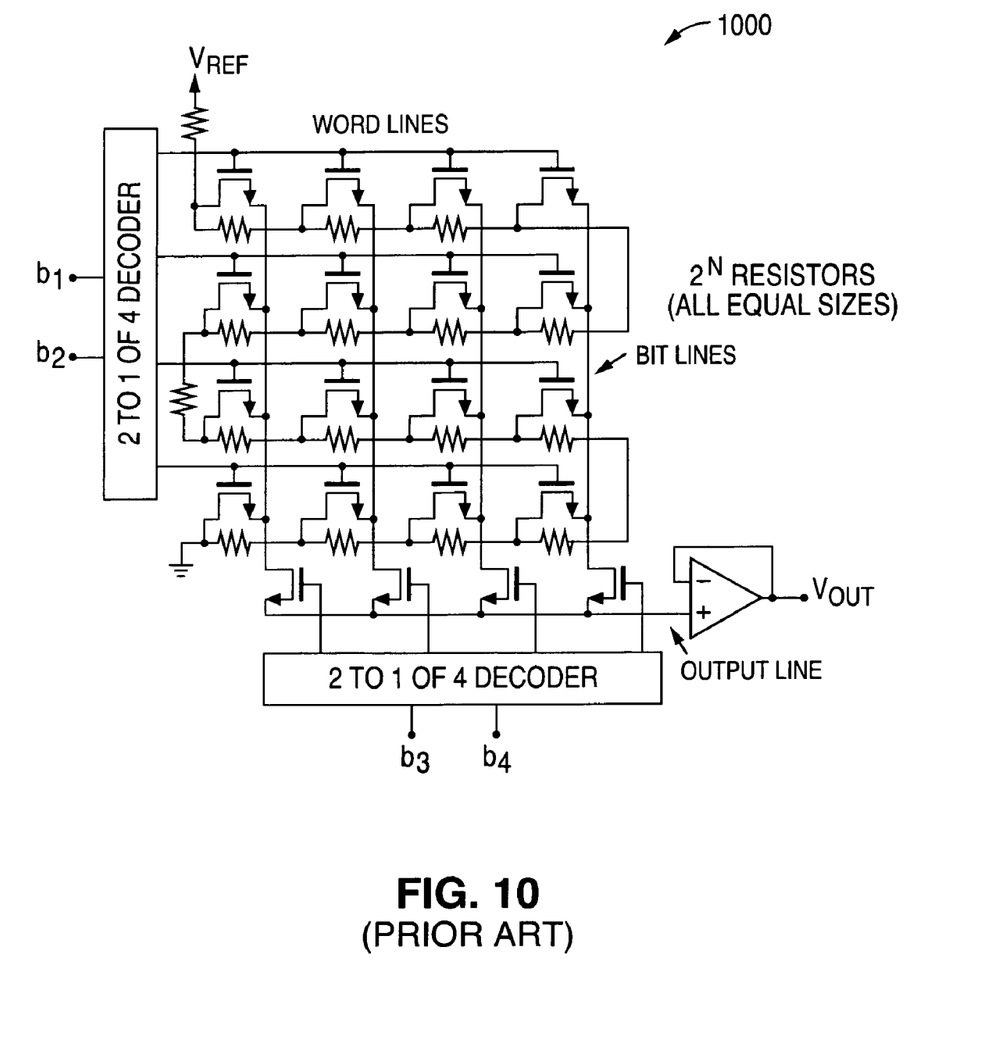
FIG. 10 illustrates a prior art folded resistor string multiplexer architecture.

An intermediate solution has been developed to provide a compromise between the "full decode" multiplexer 800 and the "tree decode" multiplexer 900. As shown in FIG. 10, the intermediate solution comprises a folded resistor string multiplexer 1000. A prior art folded resistor string multiplexer of the type shown in FIG. 10 is described in a publication by A. Abrial et al. entitled "A 27-MHz Digital-to-Analog Video Processor" published in IEEE Journal of Solid-State Circuits, Volume 23, pp. 1358-1369, December 1988.

The folded resistor string multiplexer 1000 is analogous to a standard memory address decode architecture. The switches are arranged in rows and columns to address a reference voltage and connect it to the output. Splitting up the buses greatly reduces the output capacitance, series resistance and the necessary logic. The folded resistor string multiplexer 1000 is still not an ideal solution.

Figure 11:
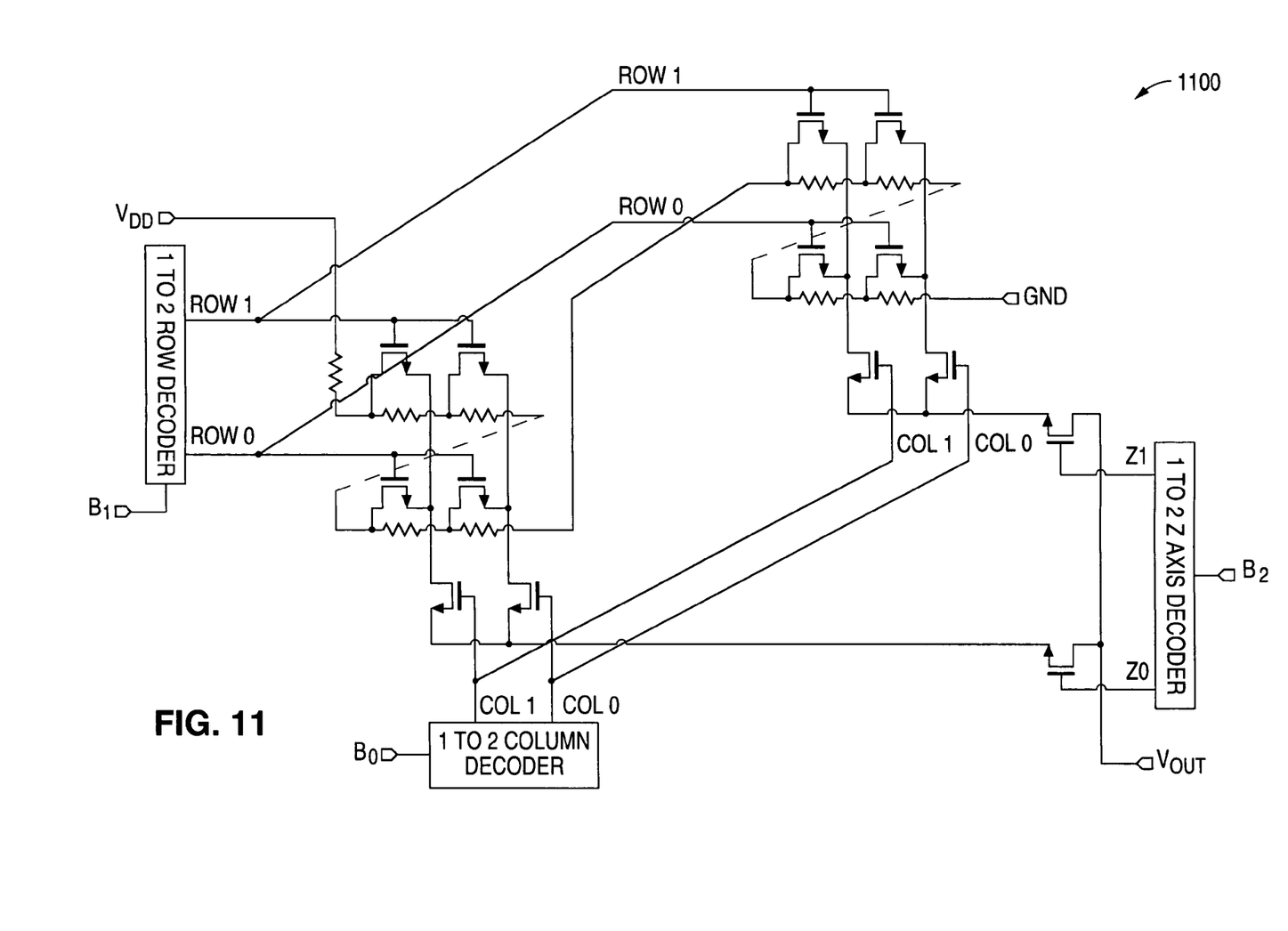
FIG. 11 illustrates an exemplary multi-dimensional multiplexer architecture of the present invention.

Another level of folding is possible to create a three dimensional structure. Three sets of decoders are required, one for each of the x, y and z dimensions. A circuit diagram of an exemplary multi-dimensional multiplexer 1100 of the present invention is shown in FIG. 11. The architecture of the multiplexer 1100 shown in FIG. 11 is a three dimensional architecture having one (1) bit in each dimension. It is understood that the invention is not limited to the specific example shown in FIG. 11. A three dimensional multiplexer of the present invention may also comprise two or more bits in each dimension.

It is also understood that the three dimensional multiplexer of the present invention shown in FIG. 11 is merely one example of a multi-dimensional multiplexer. The present invention is not limited to a three dimensional multiplexer. It is understood that the multi-dimensional multiplexer of the present invention may have more than three dimensions.

The architecture of a three dimensional multiplexer further minimizes parasitic capacitances in the signal path compared to a two dimensional folded multiplexer. Unfortunately, at the same time, the series resistance is increased. One advantage of the three dimensional multiplexer 1100 is that the logic that is required to decode the digital input code is also greatly reduced.

The number of decoding dimensions is denoted by the letter D. The number of dimensions D is not to be confused with the number of folds N in the resistor string 210. The resolution (or number of bits) is denoted by the letter B. The full decode multiplexer 800 has one dimension (D=1). The tree decode multiplexer 900 has D=B dimensions. It is interesting to note that as the value of D is increased from one (1) to two (2), one obtains the architecture of folded resistor string multiplexer 1000. As the value of D increases to the value of B, one obtains a tree decoder of multiplexer 900.

Table One shown below summarizes the series resistance, parasitic capacitance (sources and drains) and logic that are required for each of the multiplexer architectures to implement a nine (9) bit multiplexer. The logic is calculated by the number of equivalent four (4) bit AND gates that are required for the decoder blocks. The subscript D is used to identify a specific dimension of folding. For example, a three dimensional (D=3) folded eight (8) bit DAC might have three (3) bits of resolution in the first dimension, three (3) bits of resolution in the second dimension, and two (2) bits of resolution in the third dimension.

TABLE ONE

| Multiplexer Dimension (D) | Multiplexer Resistance | Total Number of Junction Capacitances | Equivalent Logic Gates |
|---|---|---|---|
| Tree Decode (D = N) | $9 \cdot R$ | $3 \cdot (N+1) - 1 = 29$ | 0 |
| Full Decode (D = 1) | $1 \cdot R$ | $2^N = 512$ | $\left(2^N \cdot \frac{N}{4}\right) = 1,152$ |
| D = 2 | $2 \cdot R$ | $(2^4 + 1) + (2^5 + 1) - 1 = 49$ | $\left(2^N \cdot \frac{4}{4}\right) + \left(2^5 \cdot \frac{5}{4}\right) = 56$ |
| D = 3 | $3 \cdot R$ | $3 \cdot (\sqrt[3]{2^N} + 1) - 1 = 26$ | $D \cdot \left(2^{\frac{N}{D}} \cdot \frac{\frac{N}{D}}{4}\right) = 18$ |
| D = 4 | $4 \cdot R$ | $(2^3 + 1) + (2^2 + 1) + (2^2 + 1) + (2^2 + 1) - 1 = 23$ | $\left(2^3 \cdot \frac{3}{4}\right) + \left(2^2 \cdot \frac{2}{4}\right) + \left(2^2 + \frac{2}{4}\right) + \left(2^2 \cdot \frac{2}{4}\right) = 12$ |
| D = K | $D \cdot R$ | $\sum_{K=1}^{D} (2^{N_K} + 1) - 1$ | $\sum_{K=1}^{D} \left(2^{N_K} \cdot \frac{N_K}{4}\right)$ |

Assuming that the impedance looking into the resistor string 210 is much greater than the switch resistances, the parasitic junction capacitances can be lumped into the load capacitance. The load capacitance is usually a buffer tied to $V_{out}$.

Adding dimensions to the multiplexer becomes more important as the resolution increases. For example, in a nine (9) bit multiplexer, using a full decode scheme will result in five hundred twelve (512) junction capacitances at the output in addition to the load of the amplifier's input devices. A two dimensional folded architecture will require a four (4) bit and a five (5) bit dimension. This will result in forty nine (49) junctions effectively tied to the output.

In a three dimensional multiplexer, the number of junctions that must be driven is reduced to twenty six (26). An additional benefit of the three dimensional architecture is that the number of equivalent logic gates for decoding the control signal is reduced to eighteen (18) from fifty six (56) in the two dimensional case.

Note that the expressions in Table One exclude the effect of interconnect parasitics. Parasitic resistance can rightfully be excluded because it is a small percentage of the total resistance in comparison to the switch resistance. The parasitic interconnect capacitances can be lumped with the parasitic junction capacitances and the sources and drains. The junction capacitances will usually dominate the nodal capacitance.

Using the expressions for resistance and capacitance in Table One for a D dimensional folded architecture, the ideal number of dimensions to minimize settling time can be found.

Approximating the time constant of the output of the multiplexer can be done using an open circuit time constant. A prior art approximation circuit 1200 is shown in FIG. 12.

Figure 12:
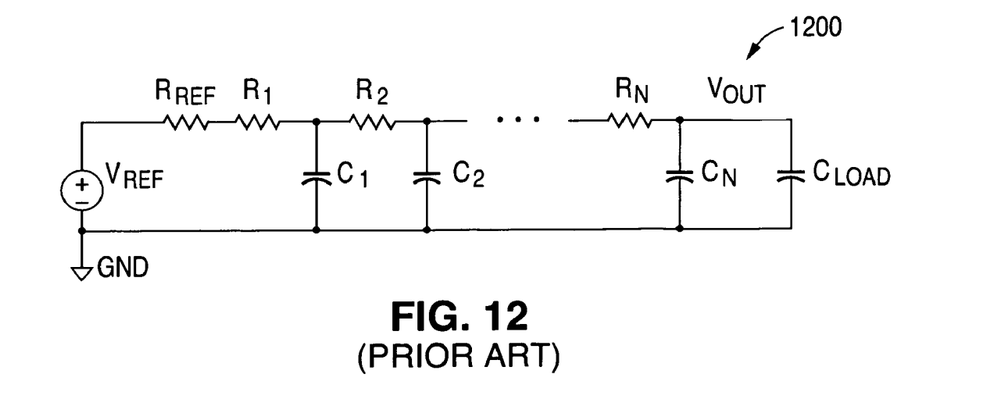
FIG. 12 illustrates a prior art approximation circuit for approximating an open circuit time constant of an output of a multi-dimensional multiplexer of the present invention.

From FIG. 12 one can see that the value of $R_S$ from FIG. 3 is equal to:

$$R_S = \sum_{i=1}^{D} R_i \qquad (Eq.\ 15)$$

The resistance $R_{ref}$ is the maximum effective impedance of the resistor string 210. Therefore, $$\tau \cong \sum_{i=1}^{N} [(R_{ref} + D \cdot R_S) \cdot (2^{B_i} + 1) \cdot C_{junc}] + (R_{ref} + D \cdot R_S) \cdot C_{load} \qquad (Eq.\ 16)$$

where $C_{junc}$ is the parasitic drain and source to bulk capacitance. Unfortunately, no closed form solution for $\tau$ exists because not every dimension in the multiplexer has the same resolution. For example, a nine (9) bit multiplexer with one (1) dimension can have four (4) bits of resolution in one dimension and five (5) bits of resolution in another dimension.

However, Equation 16 can be used to make a decision on how many dimensions result in a minimum settling time. For a small number of dimensions, the value of D times $R_S$ is small compared to $R_{ref}$ so the junction capacitances can be lumped with $C_{load}$. For a large number of dimensions, the total switch resistance will approach the voltage reference impedance and lead to an inefficient solution.

The DAC architecture 200 of the present invention provides several benefits. The DAC architecture 200 provides good DAC channel to DAC channel matching. There is a common voltage reference for each of the DAC channels. The DAC channel to DAC channel matching is limited only by offset mismatch of the output buffer 230. The implementation of the DAC architecture 200 of the present invention is also very area efficient. The voltage reference circuitry is shared by the DAC channels. In addition, gamma correction can be embedded in the resistor string 210.

The system and method of the present invention provides an efficient design procedure for minimizing power in a DAC circuit with respect to changes in the number of channels, changes in converter resolution, or changes in the conversion rate.

For example, consider a proposed design for a VGA (Video Graphics Array) display array that comprises six hundred forty (640) pixels by four hundred eighty (480) pixels. The proposed design represents four (4) times the number of pixels of the quarter VGA display. That is, the proposed VGA display array will have a total of 307,200 pixels (i.e., 640 times 480), whereas, the quarter VGA display array will have a total of 76,800 pixels (i.e., 320 times 240).

As previously mentioned, a quarter VGA display using an eighty (80) to one (1) source line multiplex ratio on the display panel requires twelve (12) DAC channels. The proposed designed will therefore use forty eight (48) DAC channels. If the number of DAC channels (and DAC outputs) are quadrupled, the settling time requirement will not be changed. Only the internal load capacitance (designated $C_{INT}$) will quadruple.

Using the expressions that have been derived (especially Equation 10 and Equation 14) one can calculate that a third fold in the resistor string 210 is necessary. Table Two below shows the result of adding a third fold when the quarter VGA display array (designated QVGA in Table Two) is quadrupled form the proposed VGA display array (designated VGA in Table Two).

TABLE TWO

|  | Number of DACs | Folds | Power/DAC | $C_{INT}$ | Area/DAC |
|---|---|---|---|---|---|
| QVGA | 12 | 2 | 292 µW | ~5 pF | 0.042 mm² |
| VGA | 48 | 3 | 240 µW | ~20 pF | 0.035 mm² |

The internal load capacitance ($C_{INT}$) quadrupled from approximately five picofarads (5 pF) to approximately twenty picofarads (20 pF). The power per DAC and the area per DAC decreased (assuming that the output buffer is unchanged). The source driver redesign is simplified by rearranging pre-existing blocks of circuitry.

This example shows how the system and method of the present invention efficiently minimizes power/DAC and area/DAC with respect to a quadrupling of the number of DAC channels. As the number of pixels increases to accommodate higher resolution display arrays, the DAC architecture 200 of the present invention can be scaled to optimize performance by selecting an appropriate number of refresh buffers 240 and folds N for the resistor string 210.

As previously described, the DAC architecture 200 of the present invention buffers the resistor string 210 by adding refresh buffers 240 at the binary fold points of the resistor string 210. For a given load capacitance and bit rate, the method of the present invention determines an appropriate number of binary fold points for the resistor string 210. In one experimental test of the DAC architecture 200 of the present invention, the use of the refresh buffers 240 reduced the DAC settling time by a factor of two (2) to under four hundred fifty nanoseconds (450 ns).

For a given load capacitance and bit rate, the method of the present invention also determines an appropriate number of dimensions for the multiplexers 220.

The performance of the DAC architecture 200 of the present invention was tested using two (2) folds in the resistor string 210. The DAC architecture 200 provided a power output per DAC of approximately two hundred fifty microwatts (250 µW), a settling time of four hundred nanoseconds (400 ns), and an area per DAC of forty two thousands of a square millimeter (0.042 mm²).

A figure of merit for DAC performance has been devised to compare the performance of the DAC architecture 200 of the present invention with the performance of prior art DAC architectures. The figure of merit is based on low power dissipation, fast settling time, small area and high number of bits of resolution for a given load capacitance. The figure of merit (designated FoM) is expressed in units of picojoules per bit areal density. The figure of merit defines DAC energy consumption relative to its bit resolution per unit area. The figure of merit is expressed as:

$$FoM = \frac{T_S \cdot P}{\left(\frac{B}{DAC}\right)\left(\frac{DACs}{mm^2}\right)} = \frac{pJ}{\frac{B}{mm^2}} \qquad (Eq.\ 17)$$

The expression $T_S$ represents the settling time. The expression P represents the power. The expression B represents the bit resolution. The expression $mm^2$ represents the area. The expression pJ represents power in picojoules ($10^{-12}$ joule). The lowest value of the figure of merit represents the best DAC performance.

A measurement of the figure of merit for the DAC architecture 200 of the present invention gave a value of approximately 0.70 pJ per bit per $mm^2$ at a resolution of nine (9) bits. Figures of merit for six older prior art DAC architectures (1989 to 2001) ranged from approximately 20.00 pJ per bit per $mm^2$ to 100.00 pJ per bit per $mm^2$. Only one figure of merit for a recent prior art DAC architecture (2005) was as low as 2.00 pJ per bit per $mm^2$ at a resolution of ten (10) bits.

The major design considerations for digital-to-analog converter (DAC) circuits for portable display applications are low power consumption, compactness, simplicity and offset. As previously described, the system and method of the present invention minimizes power consumption while achieving the required conversion rate. The utilization of refresh buffer amplifiers 240 for the resistor string 210 and the utilization of an optimized multiplexer 220 enables the DAC architecture 200 of the present invention to convert data at a moderate speed while maintaining high resolution. Other benefits of the DAC architecture 200 include the ability to easily scale the DAC architecture 200 to any number of DAC channels in power and space efficient manner.

The DAC architecture 200 of the present invention reduces the two dominant R-C time constants in the resistor string architecture used for liquid crystal display (LCD) column drivers. The DAC architecture 200 of the present invention provides reduced settling time, reduced power dissipation, a scalable circuit for adding additional channels, and a compact physical layout. The system and the design methods of the present invention set a new benchmark in DAC performance of 0.70 pJ per bit per $mm^2$.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A digital-to-analog converter circuit, comprising:
    a voltage reference resistor string;
    a plurality of digital-to-analog converter channels coupled to the voltage reference resistor string; and
    a plurality of refresh buffer circuits coupled to the voltage reference resistor string, wherein the refresh buffer circuits operate to buffer the voltage reference resistor string during a first portion of a conversion cycle and do not operate during a second portion of the conversion cycle.

2. The digital-to-analog converter circuit of claim 1, wherein each of the digital-to-analog converter channels comprises a multiplexer and an output buffer circuit.

3. The digital-to-analog converter circuit of claim 1, wherein each of the refresh buffer circuits is coupled to the voltage reference resistor string at a binary fold point of the voltage reference resistor string.

4. The digital-to-analog converter circuit of claim 3, wherein the refresh buffer circuits are operable to reduce output impedance of the voltage reference resistor string.

5. The digital-to-analog converter circuit of claim 3, wherein the voltage reference resistor string comprises $2^N$ unit resistor segments, where N represents a number of binary folds in the voltage reference resistor string.

6. The digital-to-analog converter circuit of claim 5, wherein $2^N-1$ represents a number of refresh buffer circuits coupled to the voltage reference resistor string.

7. The digital-to-analog converter circuit of claim 1, wherein each of the refresh buffer circuits is not provided a voltage by a second resistor string.

8. A digital-to-analog converter circuit comprising:
    a voltage reference resistor string;
    a plurality of digital-to-analog converter channels coupled to the voltage reference resistor string, each of the digital-to-analog converter channels comprising a multiplexer; and
    a plurality of refresh buffer circuits coupled to the voltage reference resistor string;
    wherein the multiplexer in each of the digital-to-analog converter channels comprises a multi-dimensional multiplexer; and
    wherein a number of dimensions associated with each multi-dimensional multiplexer is selected based on at least one of: an impedance of the voltage reference resistor string, a load capacitance, and a bit rate.

9. The digital-to-analog converter circuit of claim 8, wherein the number of dimensions associated with the multi-dimensional multiplexer is selected to minimize settling time.

10. The digital-to-analog converter circuit of claim 8, wherein the multi-dimensional multiplexer in each of the digital-to-analog converter channels has a different resolution in at least two of its dimensions.

11. A method, comprising:
    coupling to a voltage reference resistor string a plurality of digital-to-analog converter channels;
    determining an optimal number of binary fold points for the voltage reference resistor string to minimize power consumption in the voltage reference resistor string; and
    coupling to the voltage reference resistor string a plurality of refresh buffer circuits, wherein each of the refresh buffer circuits is coupled to the voltage reference resistor string at one of the binary fold points of the voltage reference resistor string.

12. The method of claim 11, further comprising operating the refresh buffer circuits to reduce output impedance of the voltage reference resistor string.

13. The method of claim 11, wherein:
    the voltage reference resistor string comprises $2^N$ unit resistor segments, where N represents a number of binary folds in the voltage reference resistor string; and
    $2^N-1$ represents a number of refresh buffer circuits coupled to the voltage reference resistor string.

14. The method of claim 11, further comprising:
    providing each of the digital-to-analog converter channels with a multi-dimensional multiplexer.

15. The method of claim 14, wherein the multi-dimensional multiplexer provided in each of the digital-to-analog converter channels has a different resolution in at least two of its dimensions.

16. A method comprising:
coupling to a voltage reference resistor string a plurality of digital-to-analog converter channels;
coupling to the voltage reference resistor string a plurality of refresh buffer circuits;
operating the refresh buffer circuits to buffer the voltage reference resistor string during a first portion of a conversion cycle; and
not operating the refresh buffer circuits during a second portion of the conversion cycle.

17. A display driver circuit for a liquid crystal display array, comprising:
a digital-to-analog converter circuit that comprises:
a voltage reference resistor string comprising $2^N$ unit resistor segments, where N represents a number of binary folds in the voltage reference resistor string;
a plurality of digital-to-analog converter channels coupled to the voltage reference resistor string, where $2^N-1$ represents a number of refresh buffer circuits coupled to the voltage reference resistor string, each refresh buffer circuit coupled to the voltage reference resistor string at one of a plurality of binary fold points; and
a plurality of refresh buffer circuits coupled to the voltage reference resistor string,
wherein a value of N is selected to minimize power consumption in the voltage reference resistor string.

18. The display driver circuit of claim 17, wherein:
each of the digital-to-analog converter channels comprises a multi-dimensional multiplexer.

19. The display driver circuit of claim 18, wherein the multi-dimensional multiplexer in each of the digital-to-analog converter channels has a different resolution in at least two of its dimensions.

20. An apparatus comprising:
a liquid crystal display array; and
a display driver circuit coupled to the liquid crystal display array, the display driver circuit comprising a digital-to-analog converter circuit, the digital-to-analog converter circuit comprising:
a voltage reference resistor string;
a plurality of digital-to-analog converter channels coupled to the voltage reference resistor string, each of the digital-to-analog converter channels comprising a multi-dimensional multiplexer; and
a plurality of refresh buffer circuits coupled to the voltage reference resistor string;
wherein a number of dimensions associated with each multi-dimensional multiplexer is selected based on at least one of: an impedance of the voltage reference resistor string, a load capacitance, and a bit rate.

21. The apparatus of claim 20, wherein:
the voltage reference resistor string comprises $2^N$ unit resistor segments, where N represents a number of binary folds in the voltage reference resistor string;
$2^N-1$ represents a number of refresh buffer circuits coupled to the voltage reference resistor string, each refresh buffer circuit coupled to the voltage reference resistor string at one of a plurality of binary fold points;
a value of N is selected to minimize power consumption in the voltage reference resistor string.

22. The apparatus of claim 20, wherein the multi-dimensional multiplexer in each of the digital-to-analog converter channels has a different resolution in at least two of its dimensions.

23. An apparatus comprising:
a liquid crystal display array; and
a display driver circuit coupled to the liquid crystal display array, the display driver circuit comprising a digital-to-analog converter circuit, the digital-to-analog converter circuit comprising:
a voltage reference resistor string;
a plurality of digital-to-analog converter channels coupled to the voltage reference resistor string; and
a plurality of refresh buffer circuits coupled to the voltage reference resistor string, wherein the refresh buffer circuits operate to buffer the voltage reference resistor string during a first portion of a conversion cycle and do not operate during a second portion of the conversion cycle.

* * * * *